(12) United States Patent
Kent

(10) Patent No.: US 7,384,083 B2
(45) Date of Patent: Jun. 10, 2008

(54) O-RING LOCKING MOUNT

(75) Inventor: Richard J. Kent, Newbury, NH (US)

(73) Assignee: Fabworx Solutions, Inc., Austin, TX (US)

( * ) Notice: Subject to any disclaimer, the term of this patent is extended or adjusted under 35 U.S.C. 154(b) by 7 days.

(21) Appl. No.: 11/481,139

(22) Filed: Jul. 5, 2006

(65) Prior Publication Data
US 2007/0022588 A1    Feb. 1, 2007

Related U.S. Application Data

(60) Provisional application No. 60/699,724, filed on Jul. 15, 2005.

(51) Int. Cl.
*B65G 49/07*    (2006.01)
(52) U.S. Cl. .......... 294/1.1; 294/902; 414/941
(58) Field of Classification Search .......... 294/1.1, 294/64.1, 902; 414/935, 941; 411/508
See application file for complete search history.

(56) References Cited

U.S. PATENT DOCUMENTS

| | | | | |
|---|---|---|---|---|
| 4,529,353 A | * | 7/1985 | Dean et al. | 414/810 |
| 4,555,217 A | | 11/1985 | Wright | |
| 4,620,738 A | * | 11/1986 | Schwartz et al. | 294/64.1 |
| 5,226,636 A | * | 7/1993 | Nenadic et al. | 269/21 |
| 5,333,986 A | | 8/1994 | Mizukami et al. | |
| 5,464,444 A | | 11/1995 | Farquharson et al. | |
| 5,682,795 A | | 11/1997 | Solomon et al. | |
| 5,706,559 A | * | 1/1998 | Oliver et al. | 267/49 |
| 5,775,860 A | * | 7/1998 | Meyer | 411/46 |
| 6,077,027 A | | 6/2000 | Kawamura et al. | |
| 6,189,404 B1 | | 2/2001 | Hatake et al. | |
| 6,222,337 B1 | | 4/2001 | Koreker et al. | |
| 6,360,459 B1 | | 3/2002 | Brookhart et al. | |
| 6,454,327 B1 | * | 9/2002 | Chang | 294/1.1 |
| 6,634,686 B2 | * | 10/2003 | Hosokawa | 294/1.1 |
| 6,634,851 B1 | | 10/2003 | Bonora et al. | |
| 7,055,875 B2 | * | 6/2006 | Bonora et al. | 294/64.1 |
| 2002/0166404 A1 | | 11/2002 | Rosheim | |
| 2005/0110292 A1 | * | 5/2005 | Baumann et al. | 294/64.1 |

OTHER PUBLICATIONS

"Wafer Transport Robot replaces processed wafer in 4 seconds"; Industrial News Room; Asyst Technologies, Inc.; www.industrialnewsroom.com/fullstory12450; five pages; May 13, 2004.
"Asyst's New AXYS Fastswap Advanced Wafer Transport Robot Reduces Wafer-Swap Times by 50-100 Percent"; Asyst Technologies, Inc. Press Release; Jul. 12, 2002; 2 pages.

* cited by examiner

*Primary Examiner*—Dean J Kramer
(74) *Attorney, Agent, or Firm*—John A. Fortkent; Fortkort & Houston P.C.

(57) ABSTRACT

An end effecter (201) is provided herein which comprises a blade (203) having a depression (213) formed in the surface (210) thereof, an elastomeric pad (209) disposed in the depression and a fastener (215) for releasably securing the pad within the depression such that a portion of the pad extends above the surface of the blade.

20 Claims, 5 Drawing Sheets

O-RING LOCKING MOUNT

CROSS-REFERENCE TO RELATED APPLICATION

This application claims the benefit of priority from U.S. Provisional Patent Application No. 60/699,724 filed 15 Jul. 2005, and having the same title.

FIELD OF THE DISCLOSURE

The present disclosure relates generally to end effectors for semiconductor processing, and more particularly to mounts useful for attaching support pads to the wafer-handling surfaces of such end effectors.

BACKGROUND OF THE DISCLOSURE

The processing of semiconductor substrates is integral to the manufacture of integrated circuits. Most commonly, these substrates are in the form of silicon wafers that are exposed to a number of sequential processing steps including, but not limited to, chemical vapor deposition (CVD), physical vapor deposition (PVD), etching, planarization, and ion implantation.

The use of robotic cluster tools has become standard in semiconductor processing. Such tools can process a large number of substrates through many different processing technologies, and can perform repetitive tasks quickly and accurately. Most modern semiconductor processing systems include robotic cluster tools that integrate a number of process chambers together in order to perform several sequential processing steps without removing the substrate from the highly controlled processing environment. These chambers may include, for example, degas chambers, substrate pre-conditioning chambers, cooldown chambers, transfer chambers, chemical vapor deposition chambers, physical vapor deposition chambers, and etch chambers. The combination of chambers in a cluster tool, as well as the operating conditions and parameters under which those chambers are run, may be selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through the chambers or process steps. The process recipes and sequences will typically be programmed into a microprocessor controller that will direct, control and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

As the demand for wafer throughput in semiconductor fabrication lines has increased over time, the operating speeds of the robotic arms utilized in cluster tools has also had to increase. The attendant increase in momentum of the wafers as they move through the fabrication line has thus required that certain measures be taken to ensure and maintain the proper placement of wafers on the end effectors of the robotic arms.

Initially, this was achieved by providing recesses or walls on the end effecter blade that restricted the movement of the wafer during transfer from one processing chamber or tool to another. However, this approach was found to be unsatisfactory, because movement of the wafer on the end effecter blade was not always eliminated, and removal of the wafer from the end effecter blade became more challenging. Also, contact between the wafer and the surfaces of the end effecter blade frequently resulted in the introduction of metal contaminants into the wafer. The use of vacuum suction devices in the end effecter blade to maintain the wafer in position has also been utilized, but this approach is undesirable in that it significantly increases the complexity and cost of maintaining the tool.

More recently, end effecters have been developed which utilize elastomeric support pads to maintain the wafer in its proper position on the end effecter blade. An example of such an end effecter is illustrated in FIG. 1. The end effecter 101 depicted therein includes a blade 103 which is releasably mounted in a blade mount 105 by a plurality of set screws 107. The blade 103 is equipped with 5 mushroom-shaped elastomeric support pads 109, each adapted to grip the substrate sufficiently (e.g., by creating a sufficiently high coefficient of friction with respect to the surface of the substrate) to hold the substrate in place during processing. The support pads 109 are disposed upon a major surface of the blade 103 in a configuration which is adapted to support a wafer 111 in a first position removed from the blade mount 105, as shown in FIG. 2, and in a second position adjacent to the blade mount 105, as shown in FIG. 3. The first position, in which the wafer 111 is supported on the front three support pads 109, is the position most commonly used when the wafer 111 is being handled under atmospheric conditions, while the second position, in which the wafer 111 is supported on the back three support pads 109, is the position most commonly used when the wafer 111 is being handled under vacuum conditions.

End effectors of the type depicted in FIGS. 1-3 represent a significant improvement in the art, insofar as they allow wafers to be processed by cluster tools at very fast rates, with minimal movement of the wafer during transit. However, in practice, it has been found that the mushroom-shaped elastomeric support pads 109 utilized in these end effectors require frequent replacement and servicing.

There is thus a need in the art for an improved end effecter that overcomes the aforementioned infirmities. In particular, there is a need in the art for an end effecter with a more robust support pad design. These and other needs are met by the devices and methodologies disclosed herein.

DETAILED DESCRIPTION

In one aspect, an end effector is provided which comprises (a) a blade having a first depression formed in the surface thereof, (b) an elastomeric pad disposed in said first depression, and (c) a fastener for releasably securing the pad within said first depression such that a portion of the pad extends above the surface of the blade.

In another aspect, an end effector is provided herein which comprises (a) a substantially planar blade having first and second major opposing surfaces, said first major surface having a plurality of depressions formed therein; (b) a plurality of O-rings, each disposed in one of said plurality of depressions; and (c) a plurality of fasteners, each adapted to releasably securing one of said plurality of elastomeric O-rings within one of said depressions such that a portion of the O-ring extends above the first major surface of the blade.

It has now been found that the aforementioned infirmities in support pad design arise, in part, from the friction between the wafer and the support pad. While such friction is desirable for maintaining the wafer in position, at the higher transit accelerations (and associated increased wafer momenta) required to achieve greater wafer throughput in semiconductor processing equipment, the associated increase in shear tends to pull the elastomeric mushroom-shaped support pads from their mounts (the later being holes in the blade through which the stems of the support pads extend). This can cause partial or complete removal of the support pads from the surface of the end effector blade, thus requiring replacement. The problem is exacerbated at higher processing temperatures, since the material of the blade (typically aluminum) expands. This expansion increases the diameters of the holes that the stems of the support pads sit in, thus loosening the fit between the support pads and the blade. Moreover, the material of the support pads tends to soften at higher processing temperatures, thus facilitating the deformation of the support pads required for them to be pulled from their mounts on the blade.

It has also been found that the aforementioned problem may be appropriately addressed by the provision of a suitably designed locking mount which, either alone or in combination with a suitably defined depression formed in the surface of the blade, effectively locks the elastomeric pads in place. This locking mount is especially advantageous when used in conjunction with the O-ring support pads disclosed herein.

Figure 1:
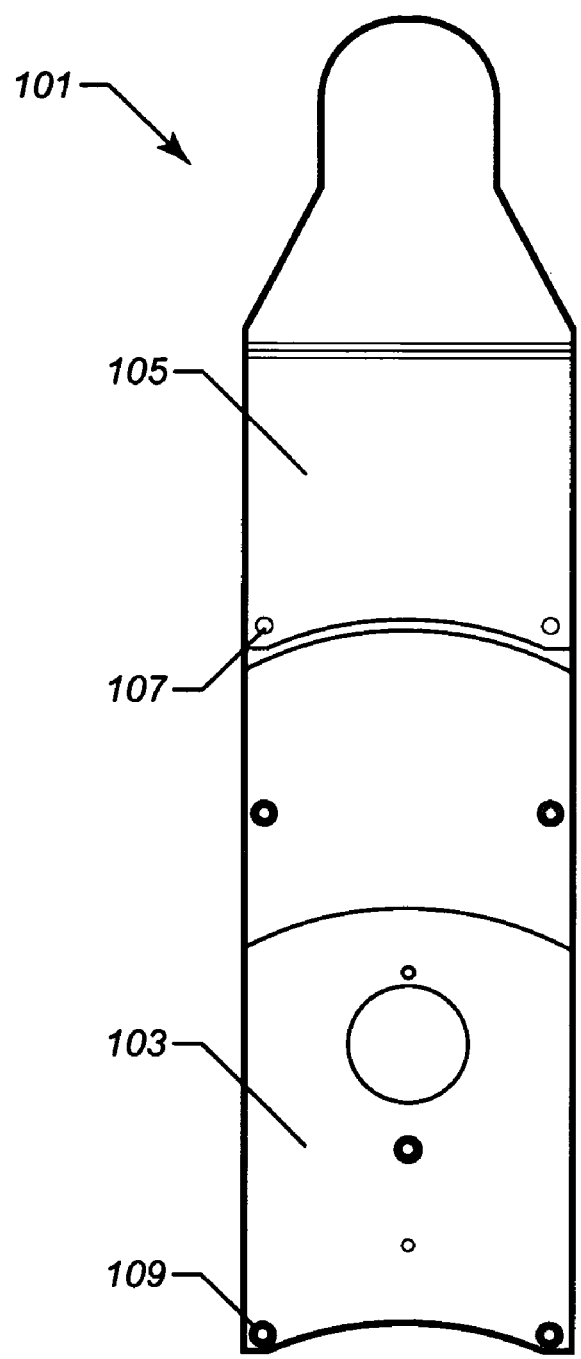
FIG. 1 is an illustration of a prior art end effecter.
Figure 2:
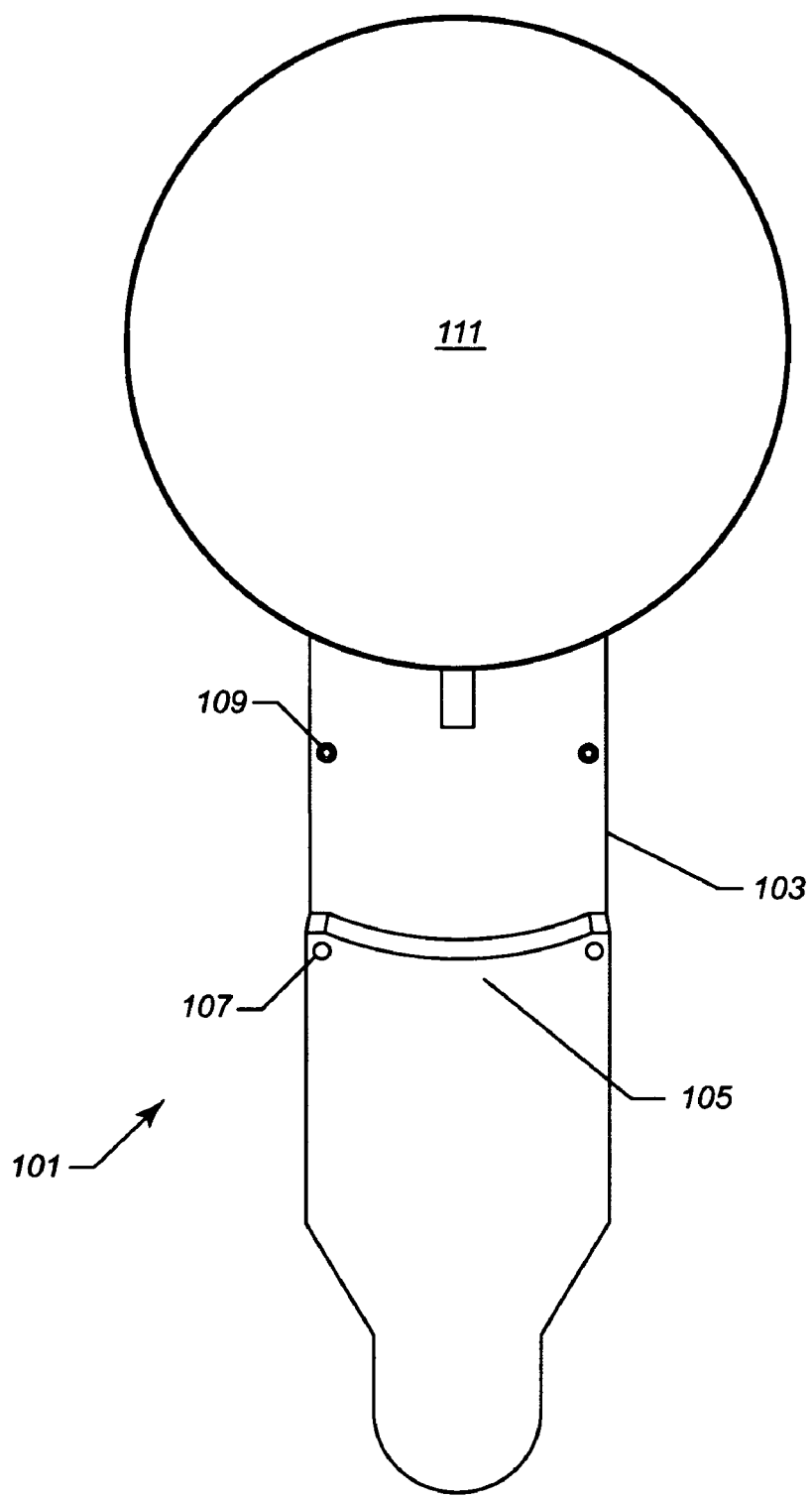
FIG. 2 is an illustration of a prior art end effecter illustrating a wafer disposed in a first position on the support pads thereof.
Figure 3:
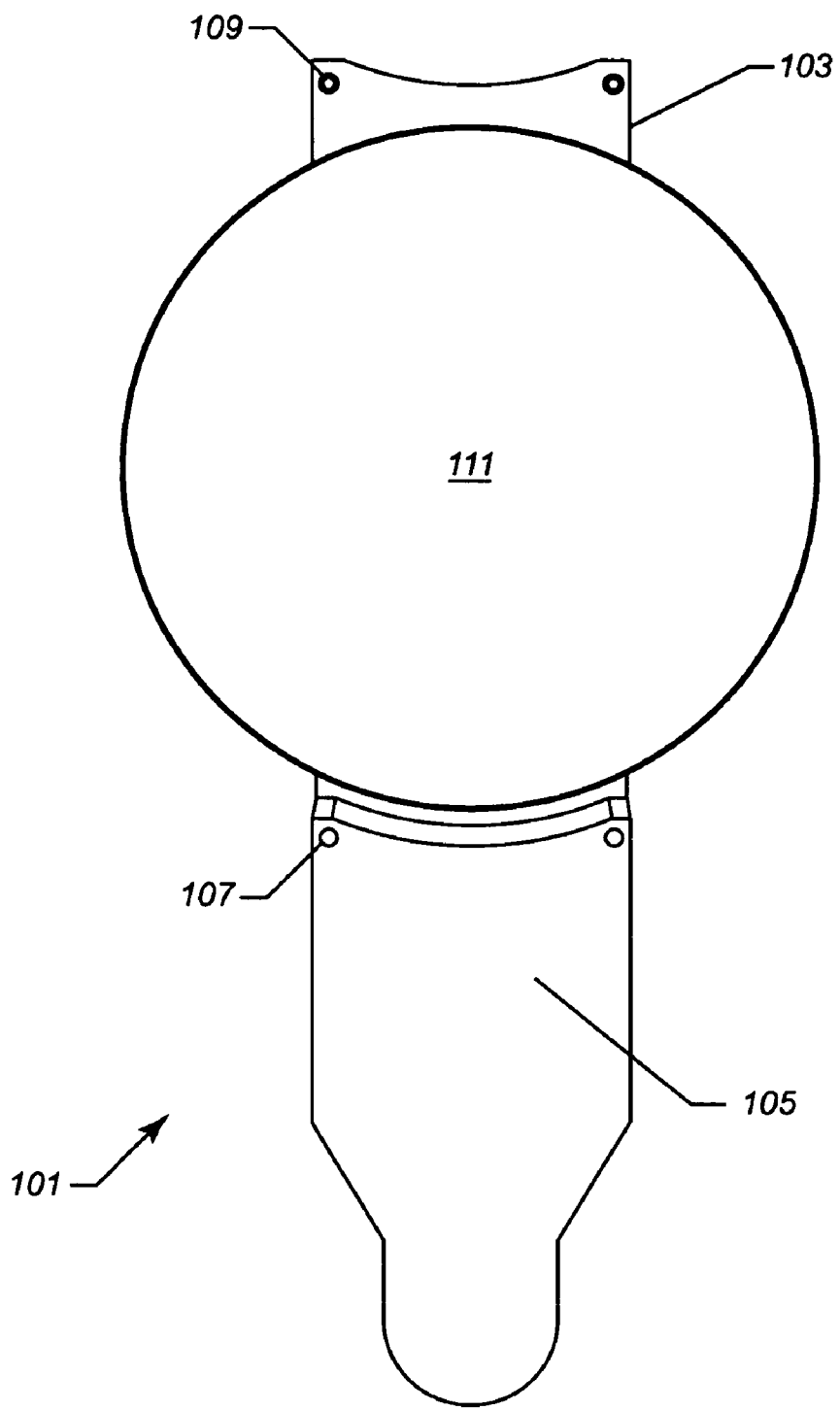
FIG. 3 is an illustration of a prior art end effecter illustrating a wafer disposed in a second position on the support pads thereof.
Figure 4:
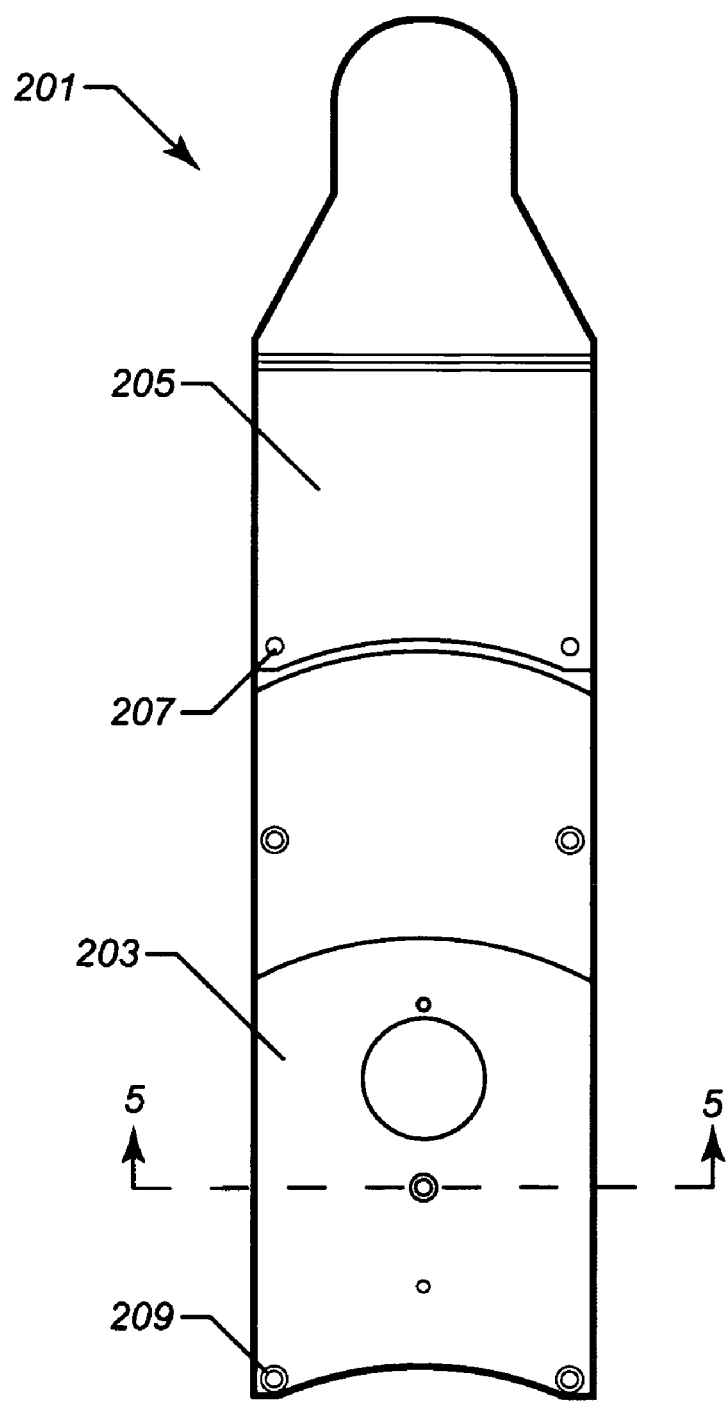
FIG. 4 is an illustration of an end effecter made in accordance with the teachings herein.

FIG. 4 illustrates one particular, non-limiting embodiment of an end effecter equipped with a locking mechanism for support pads of the type disclosed herein. The end effecter 201 depicted therein includes a blade 203 which is releasably mounted in a blade mount 205 by a plurality of set screws 207. The blade 203 is equipped with 5 elastomeric support pads 209, each adapted to grip the substrate sufficiently (e.g., by creating a sufficiently high coefficient of friction with respect to the surface of the substrate) to hold the substrate in place during processing. The support pads 209 are disposed upon a major surface of the blade 203 in a configuration which is adapted to support a wafer in a first position removed from the blade mount in the manner depicted in FIG. 2, and in a second position adjacent to the blade mount 205 in the manner depicted in FIG. 3. The first position, in which the wafer is supported on the front three support pads 209, is the position most commonly used when the wafer is being handled under atmospheric conditions, while the second position, in which the wafer is supported on the back three support pads 209, is the position most commonly used when the wafer is being handled under vacuum conditions.

Figure 5:
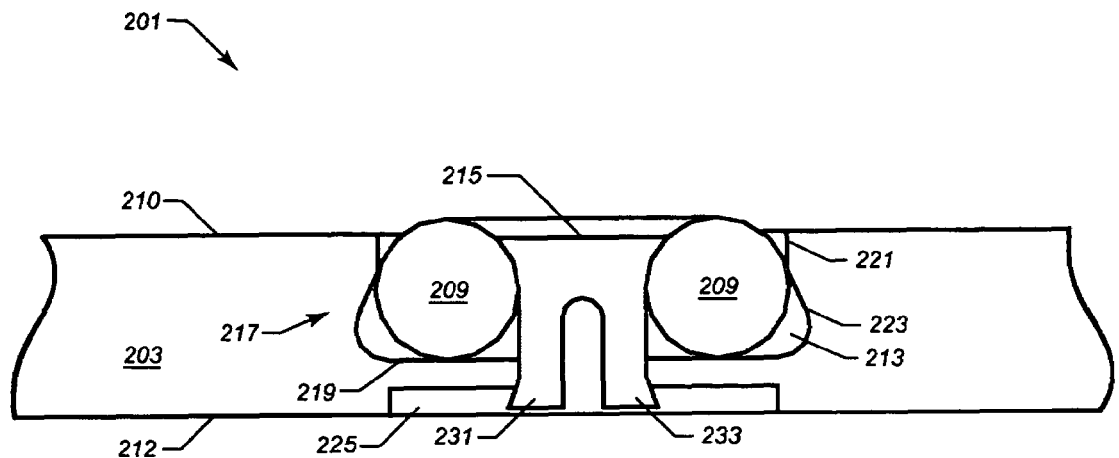
FIG. 5 is a cross-sectional view, taken along LINE 5-5 of FIG. 4, illustrating an O-ring locking mount made in accordance with the teachings herein.

The details of the support pads 209, and the means by which they are affixed to the surface of the blade 203, may be appreciated with reference to FIG. 5, which is a cross-sectional view of the blade 203 of FIG. 4 taken along the LINE 5-5. As seen therein, the first major surface 210 of the blade 203 is provided with a plurality of first depressions 213, each of which houses a support pad 209. In the particular embodiment depicted, each support pad 209 is an O-ring, and each first depression 213 is essentially complimentary in shape to the support pad 209. The support pad 209 is releasably secured within the first depression 213 by way of a fastener 215.

Figure 6:
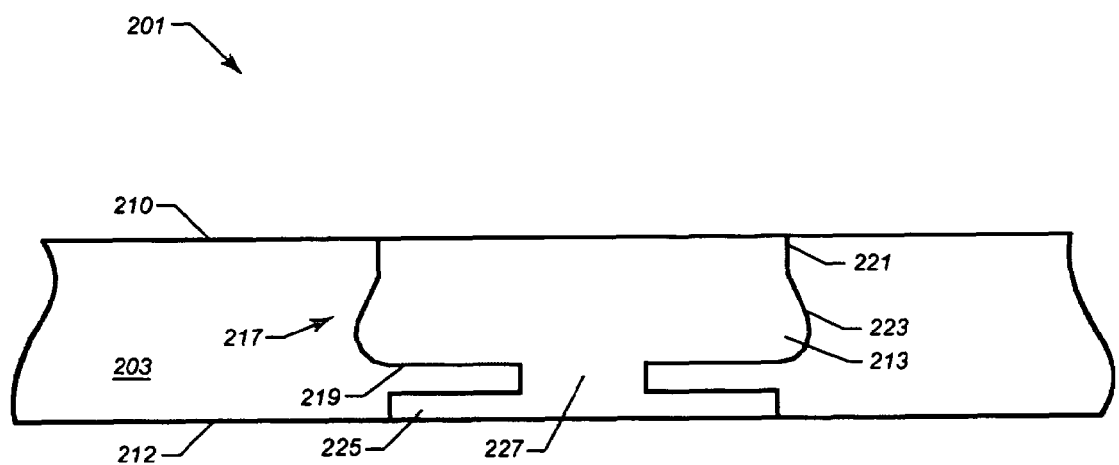
FIG. 6 is an illustration of FIG. 5 with the support pad and fastener removed.

The profile of the first depression 213 may be better appreciated with respect to FIG. 6, which depicts the structure of FIG. 5 with the fastener 215 and support pad 209 removed. As seen therein, in this particular embodiment, the first depression 213 has a profile which includes a sidewall 217 and a bottom 219. The sidewall 217 comprises a first straight, vertical portion 221 which is adjacent to the first major surface 210 of the blade 203, and a second, curved portion 223 which intersects with the bottom 219 of the first depression 213. The profile of the first depression 213 is designed such that, when the support pad 209 and fastener 215 are inserted into the first depression 213, the support pad 209 is tightly engaged between the fastener 215 and the opposing sidewall 217 of the first depression, with the top of the support pad 209 protruding above the plane of the adjacent portion of the first major surface 210 of the blade 203. This arrangement prevents the support pad 209 from becoming dislodged when it is subjected to shear. The second, curved portion 223 of the sidewall 217 permits the support pad 209 to distort slightly and expand into the curved region defined thereby, thus further securing the support pad 209 into place within the first depression 213.

Referring again to FIG. 6, a second depression 225 is provided on the second major surface 212 of the blade 203. This second depression 225 is positioned opposite the first depression 213 and is in open communication therewith by way of a channel 227. The channel 227 is adapted to accept the first 231 and second 233 prongs of the fastener. As seen in FIG. 5, the first 231 and second 233 prongs of the fastener 215 are resilient and are tapered outwardly at their distal portions so that, when they are inserted into the channel 227, they cause the fastener 215 to maintain a compressive force on the support pad 209, thereby maintaining it in position. Also as seen in FIG. 5, the depth of the second depression 225 is such that distal portions of the first 231 and second 233 prongs do not extend above the plane of the adjacent portion of the second major surface 212.

It will be appreciated from FIG. 6 that the design of the locking mount disclosed herein allows the support pad 209 to be easily replaced. In particular, the fastener 215 may be readily removed from the first depression 213 by compressing the first 231 and second 233 prongs toward each other and sliding them out of the channel 227. Once the fastener is removed, a new support pad 209 may be inserted into the first depression 213. As a further advantage of the design of the locking mount depicted in FIGS. 5-6, once one surface of the support pad 209 has become worn, it may be removed as previously described and reinserted into the first depression 213 with the opposing, fresh side facing up. This essentially doubles the lifetime of the support pad 209.

The teachings herein are not limited to the particular fastener 215 depicted in FIG. 5. For example, rather than being equipped with first 231 and second 233 resilient prongs, the fastener 215 could instead be equipped with a tapered, annular resilient skirt, which could be solid or hollow. Moreover, while the fastener 215 is generally annular in shape, one skilled in the art will appreciate that the shape of the faster 215 could be adapted to the particular shape of the support pad 209 being used. Hence, for example, if the support pad 209 was elliptical or polygonal (e.g., hexagonal, square or rectangular) in shape, a complimentary shaped fastener 215 could be utilized with it to secure the support pad 209 within the first depression 213.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. An end effecter, comprising:
    a blade having a first depression formed in the surface thereof;
    an elastomeric pad disposed in said first depression; and
    a fastener for releasably securing the pad within said first depression such that a portion of the pad extends above the surface of the blade;
    wherein said first depression has a wall and a bottom, and wherein said wall comprises (a) a first vertical section adjacent to a first major surface of the blade, and (b) a second curved section adjacent to the bottom of the first depression.

2. The end effecter of claim 1, wherein said pad is an O-ring, and wherein said fastener extends through the center of said O-ring.

3. The end effecter of claim 2, wherein said fastener has a tapered head.

4. The end effecter of claim 3, wherein said tapered head abuts a portion of the surface of the O-ring, and is essentially complimentary in shape to said portion.

5. The end effecter of claim 3, wherein said depression has a vertical wall, and wherein the minimum distance between said tapered head and said vertical wall is less than the diameter of the O-ring.

6. The end effecter of claim 2, wherein said fastener has a tapered head with a substantially planar surface, and wherein said planar surface is disposed within the annulus of said O-ring.

7. The end effecter of claim 1, wherein said second section extends outwardly from said first section.

8. The end effecter of claim 1, wherein said first depression has a wall and a bottom, wherein said bottom has an aperture therein, and wherein said fastener has at least one resilient prong that extends through said aperture.

9. The end effecter of claim 8, wherein said prong has a tapered outer surface that engages the edge of said aperture.

10. The end effecter of claim 9, wherein said blade has first and second major surfaces, wherein said pad extends above said first major surface, and wherein said aperture is in open communication with said second major surface.

11. The end effecter of claim 8, further comprising a second depression, and wherein said aperture is in open communication with said first and second depressions.

12. The end effecter of claim 1, wherein said elastomer is a fluoroelastomer.

13. The end effecter of claim 1, further comprising a plurality of depressions, each of said plurality of depressions having an elastomeric pad disposed therein.

14. The end effecter of claim 13, wherein said plurality of pads are adapted to support a wafer in a first position in which a portion of the wafer extends over the distal end of the blade, and in a second position in which no portion of the wafer extends over the distal end of the blade.

15. The end effecter of claim 14, wherein said blade has first and second opposing edges, and wherein said plurality of pads includes a first set of at least two pads disposed along a first edge of said blade, and a second set of at least two pads disposed along a second edge of said blade.

16. An end effecter, comprising:
    a substantially planar blade having first and second major opposing surfaces, said first major surface having a plurality of depressions formed therein;
    a plurality of elastomeric O-rings, each disposed in one of said plurality of depressions; and
    a plurality of fasteners, each adapted to releasably secure one of said plurality of 0-rings within one of said depressions such that a portion of the O-ring extends above the first major surface of the blade;
    wherein each of said plurality of depressions has a wall and a bottom, and wherein said wall comprises (a) a first vertical section adjacent to a first major surface of the blade, and (b) a second curved section adjacent to the bottom of the first depression.

17. The end effecter of claim 16, wherein each of said plurality of depressions has a wall and a bottom, wherein said bottom has an aperture therein, and wherein said fastener has at least one resilient prong that extends through said aperture.

18. The end effecter of claim 17, wherein said prong has a tapered outer surface that engages an edge of said aperture.

19. The end effecter of claim 16, wherein said plurality of O-rings are adapted to support a wafer in a first position in which a portion of the wafer extends over the distal end of the blade, and in a second position in which no portion of the wafer extends over the distal end of the blade.

20. The end effecter of claim 19, wherein said blade has first and second opposing edges, and wherein said plurality of O-rings includes a first set of at least two O-rings disposed along a first edge of said blade, and a second set of at least two O-rings disposed along a second edge of said blade.

* * * * *